United States Patent
Baldwin et al.

(10) Patent No.: US 7,701,293 B2
(45) Date of Patent: Apr. 20, 2010

(54) AMPLIFIER SYMMETRIC SUPPLY REGULATION

(75) Inventors: David John Baldwin, Allen, TX (US);
Russell Max Kinder, Plano, TX (US);
Patrick Muggler, Garland, TX (US);
Roy Clifton Jones, III, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 202 days.

(21) Appl. No.: 11/941,789

(22) Filed: Nov. 16, 2007

(65) Prior Publication Data

US 2008/0130331 A1 Jun. 5, 2008

Related U.S. Application Data

(63) Continuation-in-part of application No. 11/314,563, filed on Dec. 21, 2005, now abandoned.

(51) Int. Cl.
*H03F 3/04* (2006.01)

(52) U.S. Cl. ....................... 330/297; 330/298

(58) Field of Classification Search .............. 330/297, 330/298, 207 P
See application file for complete search history.

(56) References Cited

U.S. PATENT DOCUMENTS

| 5,760,652 | A |   | 6/1998  | Maemura et al. |
|-----------|---|---|---------|----------------|
| 5,784,127 | A |   | 7/1998  | Gleim et al. |
| 5,825,248 | A |   | 10/1998 | Ozawa |
| 5,834,977 | A | * | 11/1998 | Maehara et al. ............. 330/297 |
| 6,636,112 | B1 |  | 10/2003 | McCune |
| 6,825,726 | B2 | * | 11/2004 | French et al. ............... 330/297 |
| 7,471,155 | B1 | * | 12/2008 | Levesque .................... 330/297 |

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

A power converter receiving a single-sided supply which is ground-terminated and providing a regulated positive supply and a regulated negative supply that is optimized to the expected output range of a class AB amplifier, as well as providing excellent efficiency. The converter finds application as a compact converter to power an audio amplifier driving an audio device which is ground terminated, such as a speaker.

6 Claims, 5 Drawing Sheets

AMPLIFIER SYMMETRIC SUPPLY REGULATION

CROSS REFERENCE TO RELATED APPLICATIONS

This application is a continuation-in-part of application Ser. No. 11/314,563, filed Dec. 21, 2005, the entirety of which is incorporated herein by reference.

FIELD OF THE INVENTION

The present invention pertains to regulators of dual supplies amplifiers from a single source and more particularly to the use of same in order to power amplifiers translating an audio signal from a single-sided supply to a device which is ground-terminated.

BACKGROUND

There are two conventional methods to translate an audio signal from a non-zero common-mode voltage, as is commonly found in single-sided power supply systems, to a device which is ground terminated. The first is to use a DC blocking cap to AC couple the audio signal to the device, such as a speaker, without allowing the common-mode bias voltage (usually half the supply in a single-sided supply system) to result in a DC current. This solves the DC current issue, but the sharp level change from 0 volts to half supply on power-up results in a loud audible pop. Elaborate circuitry is required to charge the blocking cap sub-sonically, resulting in larger die area, and long startup times (0.5 second typical). Also, the blocking cap itself is quite large (470 uF typical), which is physically unreasonable for small handheld devices. The capacitor, in conjunction with the load impedance, also forms a high-pass filter, necessitating ever-larger capacitance for corresponding decreases in load impedance.

The second method is to level-shift the output signal so that it is ground-referenced. This approach has the advantage that the output is always ground-referenced, so the issues with power-up pop are reduced. Also, no DC blocking cap is needed. The disadvantage with this approach is that a negative power supply must be created via a type of power converter, either a capacitive (i.e. charge pump) or switched mode power supply (i.e. flyback regulator). Usually, the charge pump is employed, which provides the audio amplifier 2*Vsupply. For a given a output power requirement, the resulting 2*Vsupply may be much greater than necessary for headroom, and class AB amplifier output efficiency suffers.

Regulating the charge pump voltage to a lower negative value will yield higher efficiency for the class AB amplifier stage, but at a corresponding reduction in pump efficiency. Even then, the Class AB amplifier efficiency improvement is only for the negative output swings, since the supplies are asymmetrical. Frequency modulation methods for charge pump regulation are also fraught with other undesirable traits, such as increased negative supply ripple at lighter load, and the possibility of operation in the audio band which is not feasible.

SUMMARY

The present invention achieves technical advantages as a power converter receiving a single-sided supply which is ground-terminated and providing a positive supply and a regulated negative supply that is optimized to the expected output range of a class AB amplifier, as well as providing a symmetric positive supply having excellent efficiency. The converter finds application as a compact converter to power an audio amplifier driving an audio device which is ground terminated, such as a speaker.

DETAILED DESCRIPTION OF EMBODIMENT

Figure 1:
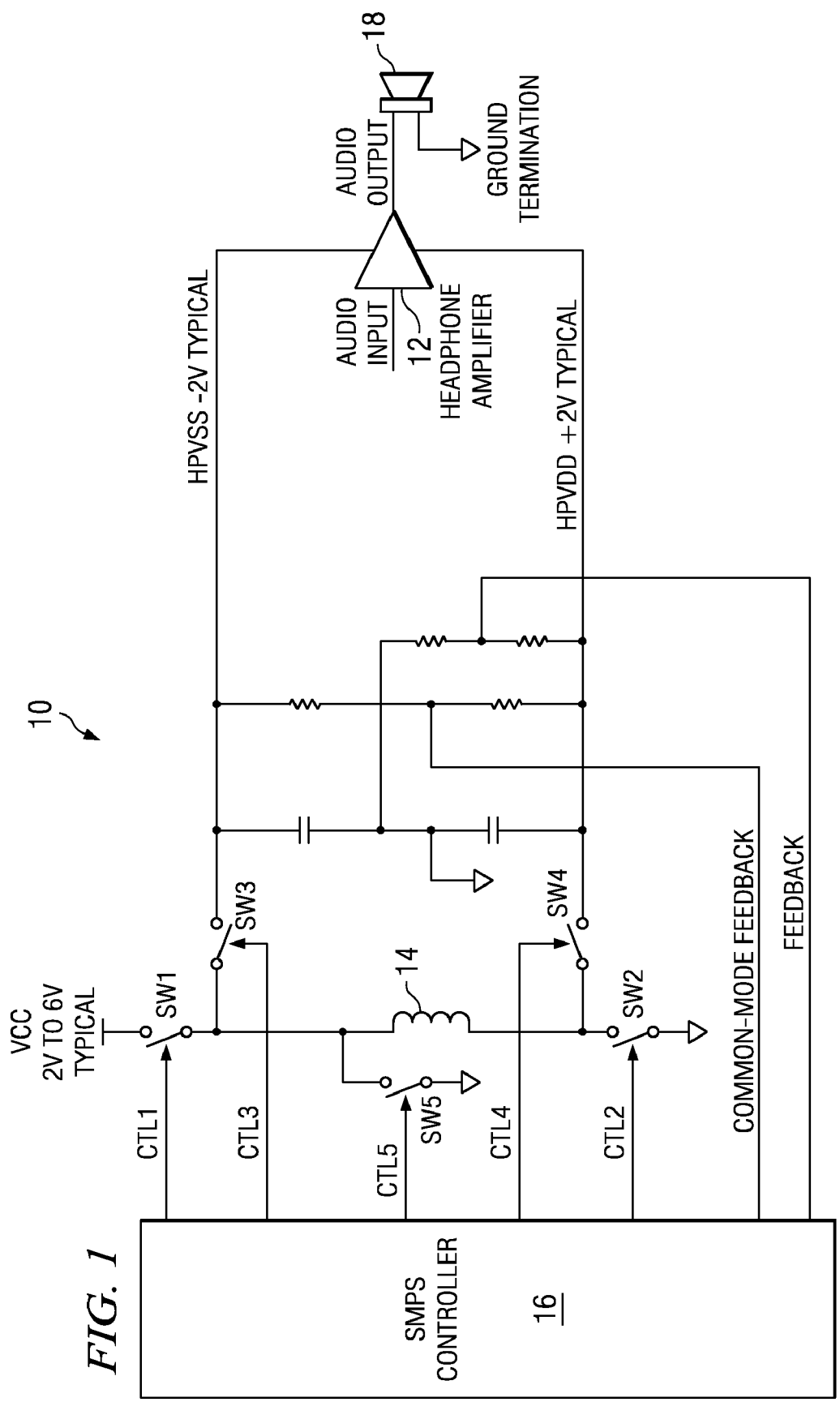
FIG. 1 is a schematic diagram of an improved SMPS circuit according to a preferred embodiment of the present invention.

Referring to FIG. 1, there is shown an improved SMPS circuit 10 configured to provide a regulated negative supply that is optimized to the expected output range of a class AB amplifier 12, as well as to provide a symmetric positive supply with an improved efficiency, which can exceed 90% efficiency.

A magnetic component, seen to comprise of an inductor 14, is provided in the circuit 10 which component 14 is now advantageously available in a compact, surface mounted form factor which renders this circuit 10 ideal for use in space-sensitive applications, such as headphone amplifiers in handheld system applications. Circuit 10 has a plurality of switches SW1-SW5 each selectively controlled by SMPS controller 16 via respective control lines CTL1-CTL5, and is configured to provide a symmetric supply pair about ground, from a single-sided supply VCC, suitable to operate an amplifier 12, which provides a ground-referenced signal to an audio device, such as a speaker 18, which is ground terminated.

Figure 2:
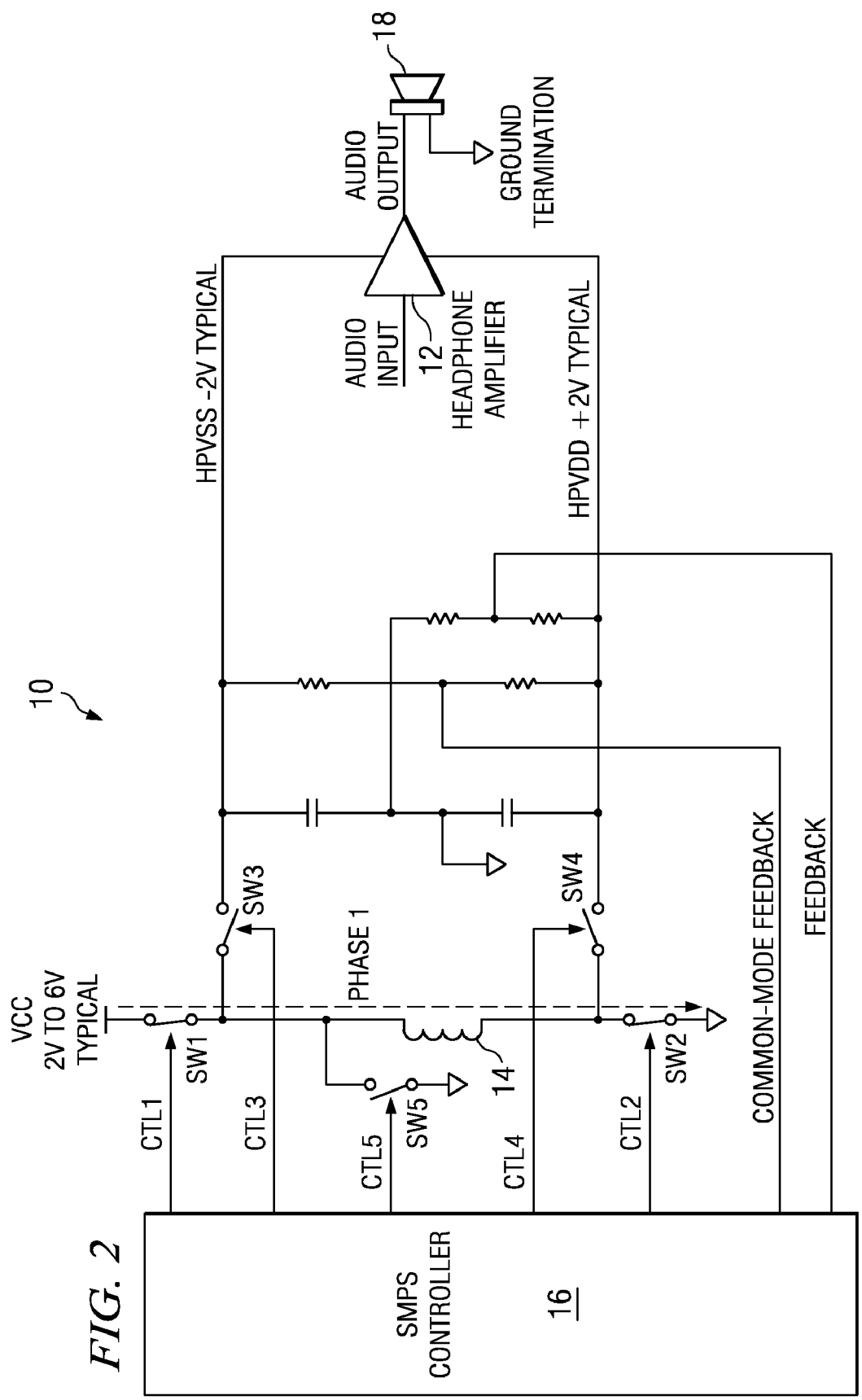
FIG. 2 depicts the first phase of current conduction through the circuit of FIG. 1.

Referring to FIG. 2, there is shown the circuit 10 having the respective switches SW1-SW5 configured by SMPS controller 16 in a first configuration to conduct current from a single-sided voltage source VCC through inductor 14 to ground. In this phase 1, the voltage imposed upon the inductor is positive, thereby effecting an increase in current corresponding to the product of the voltage and time duration in this phase, and inversely proportional to the inductance value. During this phase, energy is taken from the supply, VCC. and is stored in the inductor 14.

Figure 3:
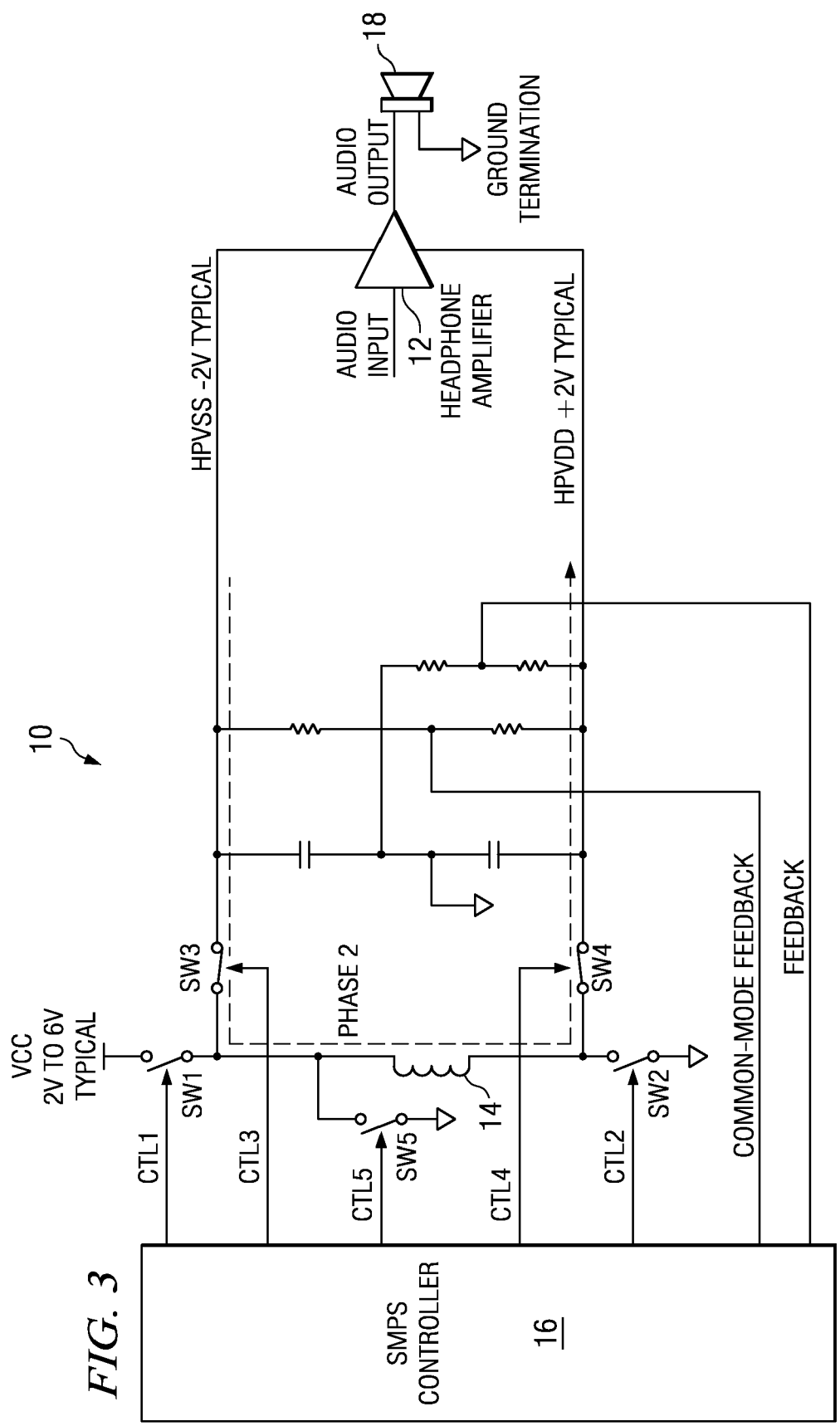
FIG. 3 depicts the second phase of current conduction through the circuit of FIG. 1.

Referring to FIG. 3, there is shown circuit 10 having switches SWI-SW5 configured in a second configuration to conduct current from the positive supply HPVDD of the amplifier through the inductor 14 to the negative supply HPVSS. In this phase 2, the energy stored in the inductor 14 is partially transferred to the capacitors from HPVDD and HPVSS to ground for the purpose of sustaining these supplies during the other cycles, and for the operation of the amplifier 12. and other circuitry not shown. During this phase, the voltage imposed across the inductor is negative, and neglecting the voltage drops across the switch elements, will be substantially equal to -HPVSS-HPVDD. The resulting change in current with time will be correspondingly negative. If the current draw from both supplies by the amplifier 12 is identical, then normal operation of the circuit will see alternating phases 1 and 2.

Figure 4:
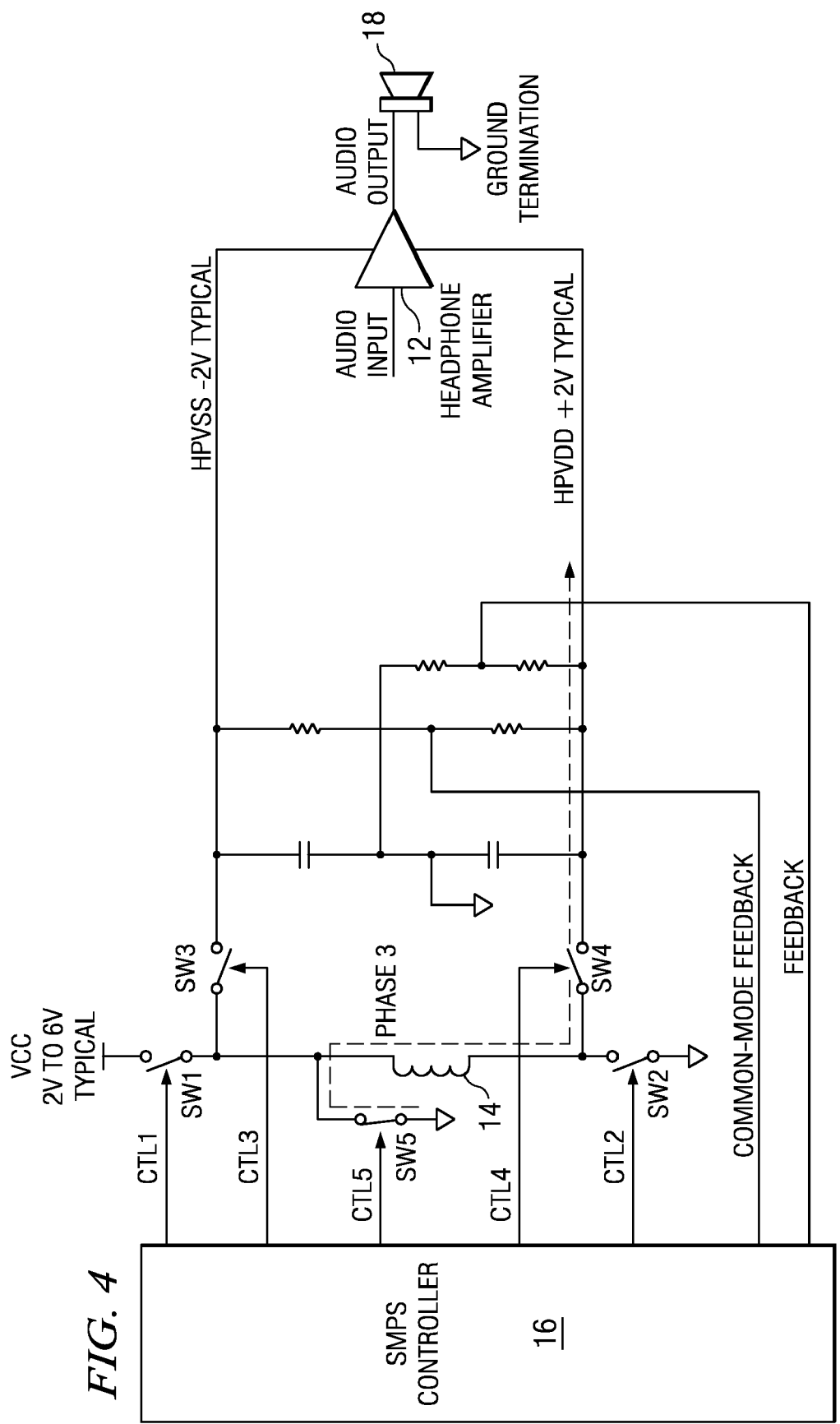
FIG. 4 depicts the third phase of current conduction through the circuit of FIG. 1.

FIG. 4, depicts the circuit 10 with the switches SW1-SW5 configured in a third configuration to conduct current from ground through the inductor 14 to the negative supply HPVSS. In this phase 3, energy from the inductor 14 is transferred to the HPVDD supply only. This phase will be seen if the current drawn by amplifier 12 is greater from HPVDD than from HPVSS. By delivering current to HPVDD from ground rather than HPVSS, the voltage at HPVDD is sustained at the required level, while ensuring that the voltage at HPVSS does not drop below its required voltage. The voltage across the inductor in this phase is substantially equal to -HPVDD, resulting in a negative change in inductor current with time.

Figure 5:
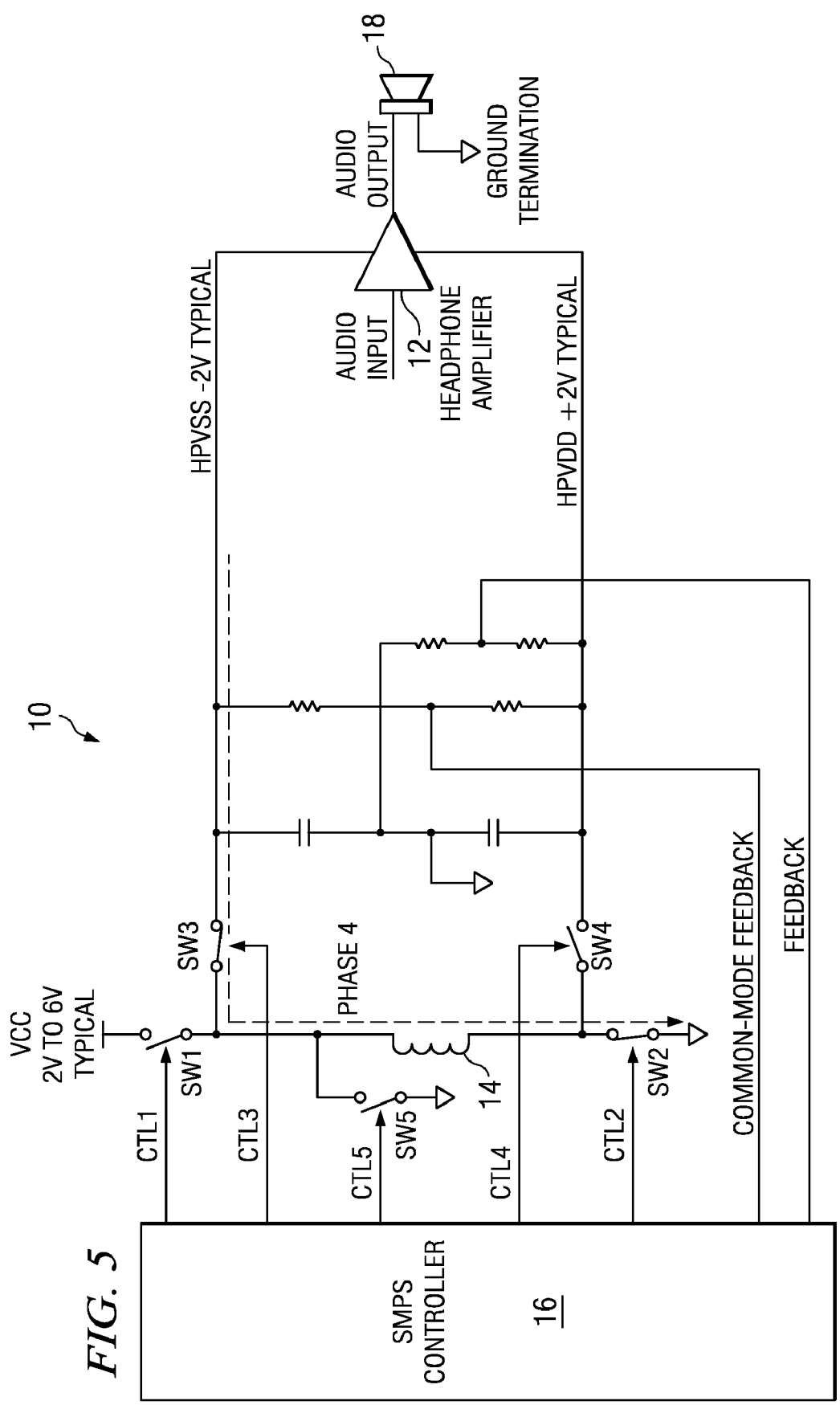
FIG. 5 depicts the fourth phase of current conduction through the circuit of FIG. 1.

FIG. 5, depicts the circuit 10 with the switches SW1-SW5 configured in a fourth state configuration to conduct current from the positive supply HPVDD to ground. In this phase 4, energy is transferred from the inductor to the HPVSS supply only. This phase will be seen if the current from amplifier 12 is greater from HPVSS than from HPVDD. By pulling current from HPVSS to ground rather than HPVDD, the voltage at HPVSS is sustained at the required level, while ensuring that the voltage at HPVDD does not rise above its required voltage. The voltage across the inductor in this phase is substantially equal to -HPVSS, resulting in a negative change in inductor current with time.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. An apparatus comprising:
   a first supply rail;
   a second supply rail;
   an amplifier having a first power supply terminal and a second power supply terminal;
   a resistor-capacitor (RC) network coupled between first and second power supply terminals;
   a first switch coupled to the first supply rail;
   a second switch coupled between first switch and the first power supply terminal;
   a third switch coupled to the second supply rail;
   a fourth switch coupled between second switch and the second power supply terminal;
   an inductor coupled to a first node between the first and second switches and a second node between the third and fourth switches;
   a fifth switch that is coupled between the inductor and the second supply rail; and
   a controller that is coupled to the RC network so as to receive feedback from the RC network and that is coupled to each of the first, second, third, fourth, and fifth switches so as to actuate and deactauate each of the first, second, third, fourth, and fifth switches in each of a first phase, a second phase, a third phase, and a fourth phase.

2. The apparatus of claim 1, wherein, in the first phase, the first and third switches are actuated and the second, fourth, and fifth switches are deactuated.

3. The apparatus of claim 2, wherein, in the second phase, the second and fourth switches are actuated and the first, third, and fifth switches are deactuated.

4. The apparatus of claim 3, wherein, in the third phase, fourth and fifth switches are actuated and the first, second, and third switches are deactuated.

5. The apparatus of claim 4, wherein, in the fourth phase, the second and third switches are actuated and the first, fourth, and fifth switches are deactuated.

6. The apparatus of claim 1, wherein the RC network further comprises:
   a first capacitor coupled between the first power supply terminals and the second supply rail;
   a second capacitor coupled between the second power supply terminal and the second supply rail;
   a first divider coupled between the second supply rail and the second power supply terminal; and
   a second divider that is coupled between the first and second power supply terminals.

* * * * *